(12) United States Patent
Hsin et al.

(10) Patent No.: US 10,600,829 B2
(45) Date of Patent: Mar. 24, 2020

(54) PACKAGE BASE CORE AND SENSOR PACKAGE STRUCTURE

(71) Applicant: KINGPAK TECHNOLOGY INC., Hsin-Chu County (TW)

(72) Inventors: Chung-Hsin Hsin, Hsin-Chu County (TW); Chen-Pin Peng, Hsin-Chu County (TW); Chien-Heng Lin, Hsin-Chu County (TW); Kun-Chih Hsieh, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 23 days.

(21) Appl. No.: 15/657,301

(22) Filed: Jul. 24, 2017

(65) Prior Publication Data

US 2018/0068912 A1 Mar. 8, 2018

(30) Foreign Application Priority Data

Sep. 2, 2016 (CN) .......................... 2016 1 0800858

(51) Int. Cl.
*H01L 23/02* (2006.01)
*H01L 27/146* (2006.01)
(Continued)

(52) U.S. Cl.
CPC ...... *H01L 27/14618* (2013.01); *G01D 11/245* (2013.01); *H01L 21/56* (2013.01);
(Continued)

(58) Field of Classification Search
CPC ..... H01L 23/04; H01L 23/3121; H01L 23/16; H01L 23/31; H01L 23/532; H01L 24/83; H01L 21/56; H01L 23/564; H01L 27/14618; H01L 27/14625; H01L 21/565; H01L 31/0203; G01D 11/245
See application file for complete search history.

(56) References Cited

U.S. PATENT DOCUMENTS 6,680,525 B1 * 1/2004 Hsieh ................ H01L 27/14618
257/678
9,781,323 B1 * 10/2017 Wang .................... H04N 5/2253
(Continued)

FOREIGN PATENT DOCUMENTS

CN         2632861 Y    8/2004
CN       105681640 A    6/2016
(Continued)

*Primary Examiner* — Shouxiang Hu
(74) *Attorney, Agent, or Firm* — Li & Cai Intellectual Property (USA) Office

(57) ABSTRACT

The present disclosure provides a package base core and a sensor package structure. The package base core includes a substrate and at least one stopper, or the package base core includes a substrate, at least one stopper, and a compound. The sensor package structure includes a substrate, a first stopper, a second stopper, a sensing member, a first compound, a second compound, and a translucent member. The stopper (or the first and second stoppers) of the present disclosure is provided to form with a protruding portion on the substrate, so that an overflowing of the compound can be avoided, thereby increasing the reliability of the package base core.

8 Claims, 6 Drawing Sheets

(51) Int. Cl.
  *H01L 23/04*      (2006.01)
  *H01L 23/16*      (2006.01)
  *H01L 21/56*      (2006.01)
  *H01L 23/532*     (2006.01)
  *H01L 23/00*      (2006.01)
  *H01L 23/31*      (2006.01)
  *G01D 11/24*      (2006.01)
  *H01L 31/0203*    (2014.01)

(52) U.S. Cl.
  CPC .............. *H01L 23/04* (2013.01); *H01L 23/16* (2013.01); *H01L 23/31* (2013.01); *H01L 23/3121* (2013.01); *H01L 23/532* (2013.01); *H01L 23/564* (2013.01); *H01L 24/83* (2013.01); *H01L 27/14625* (2013.01); *H01L 31/0203* (2013.01); *H01L 21/565* (2013.01)

(56) References Cited

U.S. PATENT DOCUMENTS

| | | | |
|---|---|---|---|
| 10,170,508 B2* | 1/2019 | Tu | H01L 27/14618 |
| 2009/0051052 A1* | 2/2009 | Yoshioka | H01L 23/3107 |
| | | | 257/788 |
| 2016/0191767 A1* | 6/2016 | Otani | G02B 7/08 |
| | | | 348/373 |
| 2017/0280027 A1 | 9/2017 | Wang et al. | |
| 2019/0019834 A1* | 1/2019 | Tu | H01L 27/14636 |

FOREIGN PATENT DOCUMENTS

| | | |
|---|---|---|
| TW | 200614457 A | 5/2006 |
| TW | 200921863 A | 5/2009 |
| TW | M515206 U | 1/2016 |

* cited by examiner

PACKAGE BASE CORE AND SENSOR PACKAGE STRUCTURE

BACKGROUND OF THE INVENTION

1. Field of the Invention

The present disclosure relates to a package base core and a sensor package structure; in particular, to a package base core and a sensor package structure each having stoppers.

2. Description of Related Art

The packaging quality of conventional sensors is greatly affected by the reliability of the manufacturing process of a compound or a dam core.

However, in the conventional packaging process of a connecting pad or a sensor, an overflowing of compound or an unstable connection between the compound and the dam core affects production yield and product reliability, which may result in increased costs, product returns, damage to reputation, or even overall damage to supply companies or chains.

Accordingly, providing a simple and effective package base core is an important issue in the packaging industry, the semiconductor industry, and other related industries. Specifically, the package base core needs to be implemented at a lower cost without the use of a complicated process or an expensive apparatus, and the package base core needs to be provided with a new structure to avoid an overflowing of compound and to more firmly connect the compound and the substrate, thereby improving production yield and product reliability.

SUMMARY OF THE INVENTION

The present disclosure provides a package base core and a sensor package structure each having stoppers (or a first stopper and a second stopper). By forming of the stoppers, the package base core can have protruding portions so that an overflowing of the compound can be avoided and the reliability of the package base core can be increased by use of the protrusions.

The present disclosure provides a package base core. The package base core includes a substrate and two stoppers. The substrate has an upper surface and a lower surface opposite to the upper surface. The two stoppers are disposed on the upper surface, and each of the two stoppers includes an exposed portion and a shielding portion arranged beside the exposed portion. A distance between the two exposed portions is defined as a first distance, a distance between the two shielding portions is defined as a second distance, and the first distance is larger than the second distance.

Preferably, the package base core further includes a compound, and the compound is disposed on a portion of the upper surface corresponding in position to the second distance and covers the two shielding portions.

Preferably, a side of the compound has a slanting angle with respect to a fictitious plane perpendicular to the substrate.

Preferably, the compound further includes a step portion arranged distant from the substrate.

Preferably, in each of the two stoppers, the exposed portion includes a protrusion and a covering layer covering the protrusion, and the covering layer is connected to the shielding portion.

Preferably, each of the protrusions is made of metal.

Preferably, in each of the two stoppers, the covering layer and the shielding portion are made of the same material.

The present disclosure also provides a package base core. The package base core includes a substrate, at least one connecting pad, two stoppers, and a compound. The substrate has an upper surface and a lower surface opposite to the upper surface. The at least one connecting pad is disposed on the upper surface. The two stoppers are disposed on a portion of the upper surface adjacent to the at least one connecting pad, and each of the two stoppers includes an exposed portion and a shielding portion arranged beside the exposed portion. The compound is disposed on the two shielding portions.

The present disclosure further provides a sensor package structure. The sensor package structure includes a substrate, a first stopper, a second stopper, a sensing member, a first compound, a second compound, and a translucent member. The substrate has an upper surface and a lower surface opposite to the upper surface. The first stopper is disposed on the upper surface, and the first stopper includes a first exposed portion and a first shielding portion arranged beside the first exposed portion. The second stopper is disposed on the upper surface, and the second stopper includes a second exposed portion and a second shielding portion arranged beside the second exposed portion. The sensing member is arranged between the first stopper and the second stopper. The first compound is disposed on the upper surface and covers the first shielding portion. The second compound is disposed on the upper surface and covers the second shielding portion. The translucent member is arranged above the sensing member. Two opposite ends of the translucent member are respectively connected to the first compound and the second compound.

Preferably, a distance between the first exposed portion and the second exposed portion is smaller than that between the first shielding portion and the second shielding portion, and the sensing member is arranged between the first exposed portion and the second exposed portion.

Preferably, each of the first exposed portion and the second exposed portion includes a protrusion and a covering layer covering the protrusion.

Preferably, a portion of the first compound covers the first shielding portion, the other portion of the first compound is disposed on the substrate, a portion of the second compound covers the second shielding portion, and the other portion of the second compound is disposed on the substrate.

Preferably, a side of the first compound arranged adjacent to the first exposed portion has a first slanting angle with respect to a fictitious plane perpendicular to the substrate, and a side of the second compound arranged adjacent to the second exposed portion has a second slanting angle with respect to the fictitious plane.

Preferably, the first compound has a first step portion, the second compound has a second step portion, and two opposite ends of the translucent member are respectively disposed on the first step portion and the second step portion.

Preferably, the sensor package structure further includes at least one first connecting pad and at least one second connecting pad. The at least one first connecting pad is arranged between the first exposed portion and the sensing member, and the at least one second connecting pad is arranged between the second exposed portion and the sensing member.

Preferably, the sensing member is electrically connected to the at least one first connecting pad and the at least one second connecting pad by use of conductive wires.

In summary, the present disclosure has the following advantages over the prior art: the present disclosure can be implemented without using a complicated process or an expensive apparatus, thereby having a low cost; an overflowing of the compound can be avoided by use of the stoppers (or the first stopper and the second stopper).

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

References are hereunder made to the detailed descriptions and appended drawings in connection with the present disclosure. However, the appended drawings are merely provided for exemplary purposes, and should not be construed as restricting the scope of the present disclosure.

[First Embodiment]

Figure 1:
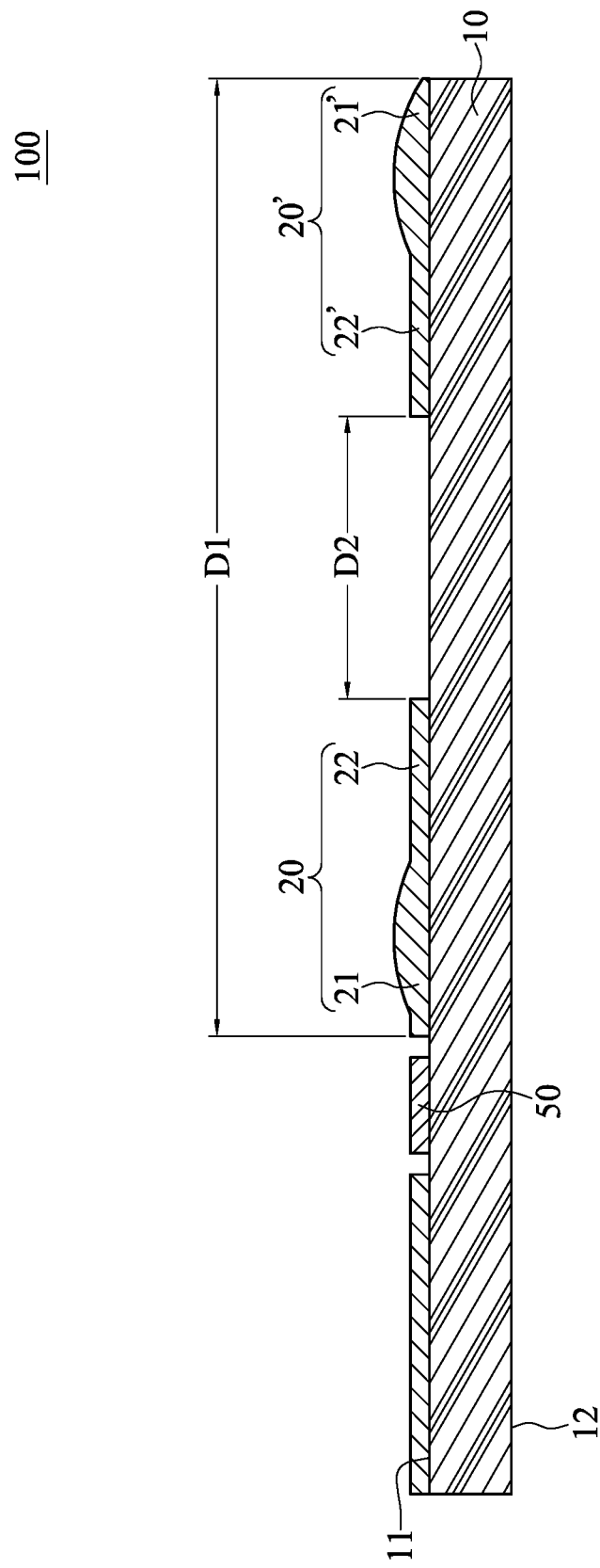
FIG. 1 is a cross-sectional view showing a package base core provided with two stoppers according to a first embodiment of the present disclosure.

Reference is first made to FIG. 1, which illustrates a first embodiment of the present disclosure. The present embodiment discloses a package base core 100 including a substrate 10 and at least one stopper 20 or 20'.

As shown in FIG. 1, the substrate 10 has an upper surface 11 and a lower surface 12 opposite to the upper surface 11. The substrate 10 can be a circuit substrate having at least one circuit cooperated with at least one via hole thereof. The upper surface 11 of the substrate 10 can be made of nonwovens.

As shown in FIG. 1, a first stopper 20' and a second stopper 20 are disposed on the upper surface 11 of the substrate 10. The first stopper 20' has a first exposed portion 21' and a first shielding portion 22' arranged beside the first exposed portion 21'. The second stopper 20 has a second exposed portion 21 and a second shielding portion 22 arranged beside the second exposed portion 21. It should be noted that the first stopper 20' and the second stopper 20 are in a mirror symmetrical arrangement.

Each of the stoppers 20, 20' (i.e., the first stopper 20' or the second stopper 20) can be formed in a circle ring shape or a square ring shape. Each of the stoppers 20, 20' can be a metallic ring fixed on the upper surface 11 of the substrate 10.

The two exposed portions 21', 21 have a first distance D1 there-between, the two shielding portions 22', 22 are arranged adjacent to each other and have a second distance D2 there-between, and the first distance D1 is larger than the second distance D2. Specifically, a distance between the first exposed portion 21' and the second exposed portion 21 is defined as the first distance D1, and a distance between the first shielding portion 22' and the second shielding portion 22 is defined as the second distance D2.

In addition, the package base core 100 in the present embodiment further includes a connecting pad 50 disposed on the upper surface 11. It should be noted that the connecting pad 50 can be disposed on or not disposed on the substrate 10.

[Second Embodiment]

Figure 2:
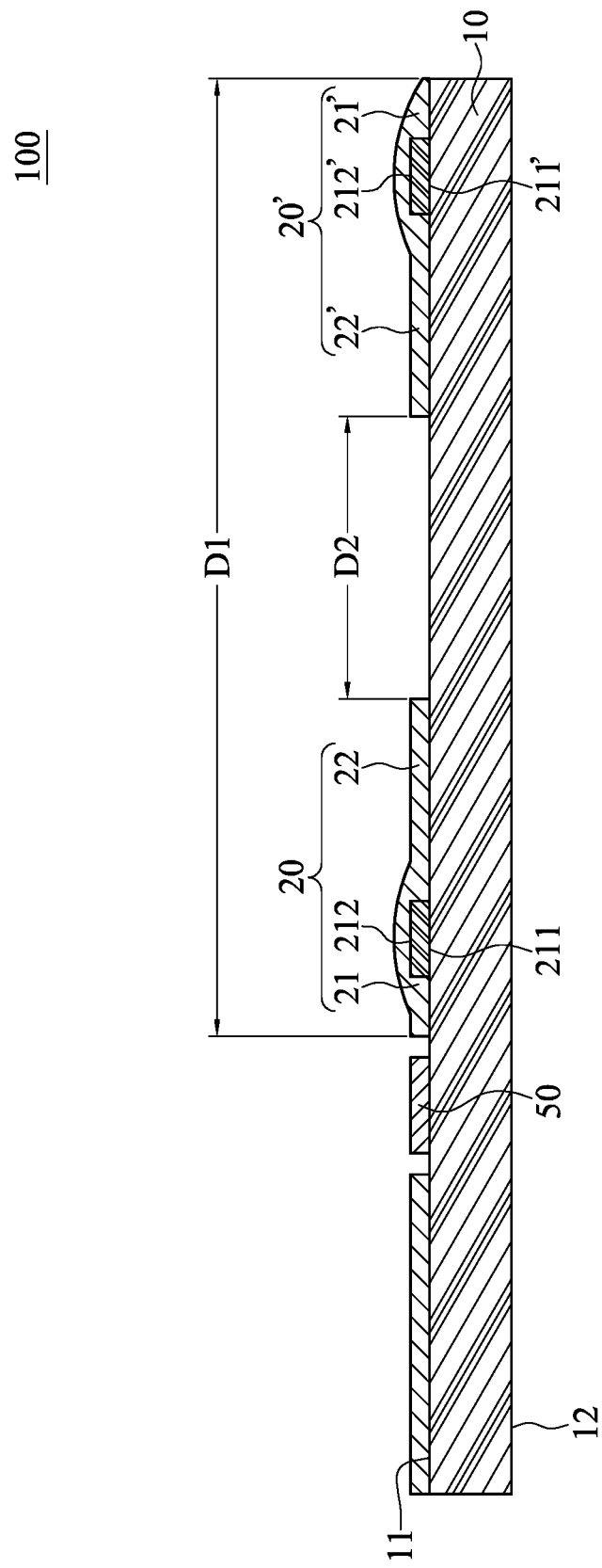
FIG. 2 is a cross-sectional view showing a package base core provided with two stoppers according to a second embodiment of the present disclosure.

Reference is made to FIG. 2, which illustrates a second embodiment of the present disclosure. The package base core 100 of the present embodiment is similar to that of the first embodiment, and the difference between the present embodiment and the first embodiment is disclosed as follows. Each of the first exposed portion 21' and the second exposed portion 21 in the present embodiment further includes a protrusion 211', 211 and a covering layer 212', 212 covering the protrusion 211', 211, and the covering layers 212', 212 are respectively connected to the shielding portions 22', 22.

Moreover, each of the protrusions 211', 211 can be made of metal, and each covering layer 212', 212 and the connected shielding portion 22', 22 can be made of the same material.

[Third Embodiment]

Figure 3:
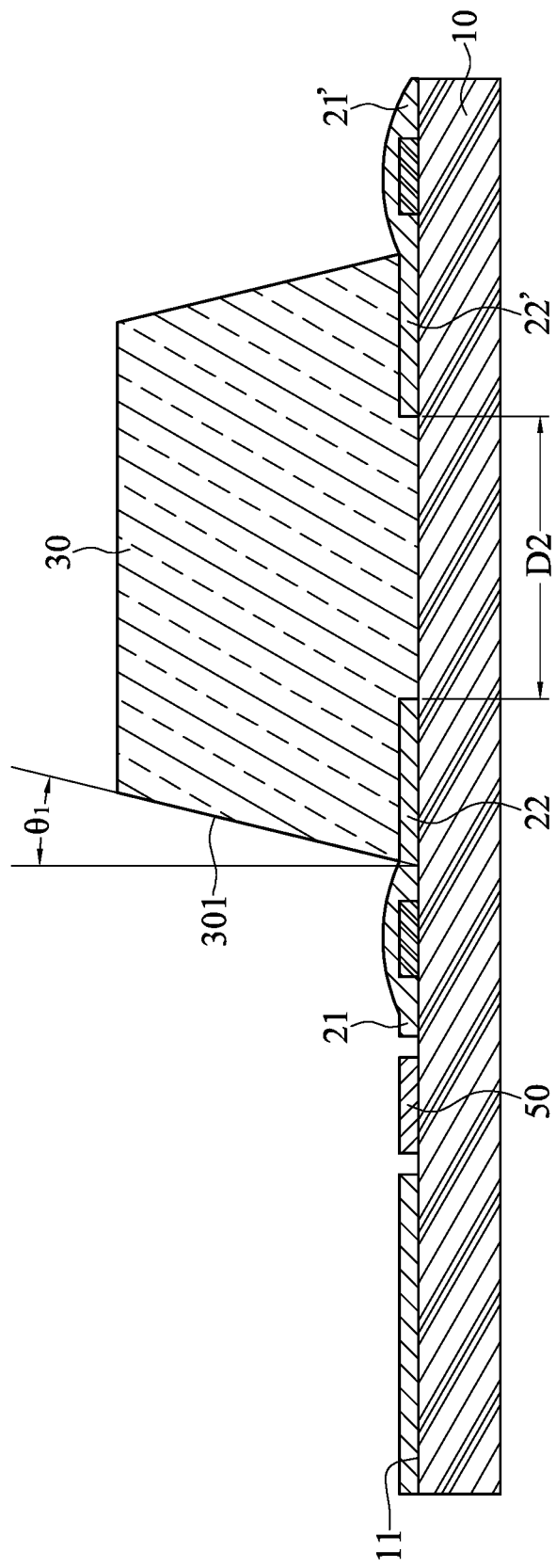
FIG. 3 is a cross-sectional view showing a package base core provided with two stoppers and a compound according to a third embodiment of the present disclosure.

Reference is made to FIG. 3, which illustrates a third embodiment of the present disclosure. The package base core 100 in the present embodiment further includes a compound 30 disposed on the upper surface 11 of the substrate 10. The compound 30 is disposed on a portion of the upper surface 11 corresponding in position to the second distance D2 and covers the two shielding portions 22', 22. Specifically, the compound 30 covers the first shielding portion 22' and the second shielding portion 22, and the compound 30 entirely covers the portion of the upper surface 11 corresponding in position to the second distance D2.

As shown in FIG. 3, a side 301 of the compound 30 can be a slanting surface having a slanting angle θ1 with respect to a fictitious plane perpendicular to the upper surface 11 of the substrate 10. The slanting surface of the compound 30 is provided for easily demolding the compound 30 from a mold. Moreover, the slanting angle θ1 is within a range of 1~20 degrees.

[Fourth Embodiment]

Figure 4:
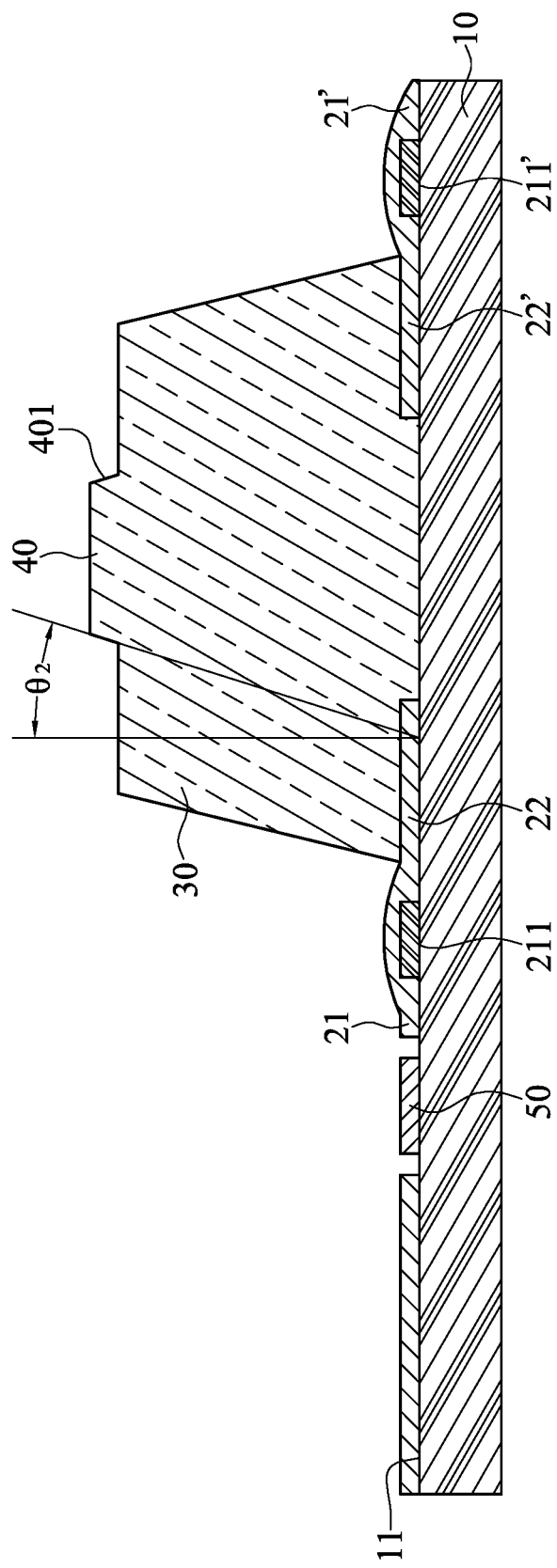
FIG. 4 is a cross-sectional view showing a package base core provided with two stoppers and a compound having a step portion according to a fourth embodiment of the present disclosure.

Reference is made to FIG. 4, which illustrates a fourth embodiment of the present disclosure. The compound 30 of the present embodiment further includes a step portion 40 arranged distant from the substrate 10. A side 401 of the step portion 40 can be a slanting surface having a slanting angle θ2 with respect to a fictitious plane perpendicular to the upper surface 11 of the substrate 10. The step portion 40 of the compound 30 can also be provided for easily demolding the compound 30 from a mold. The compound 30 having the step portion 40 can be used as a retaining wall and can be easily applied to firmly combine with a translucent plate or other components. Moreover, the slanting angle θ2 is within a range of 1~10 degrees.

As shown in FIGS. 1 to 4, each of the stoppers of the package base core 100 is formed with a protruding portion of the exposed portion, so that an overflowing of the compound 30 in the manufacturing process can be avoided by use of the protruding portions.

[Fifth Embodiment]

Figure 5:
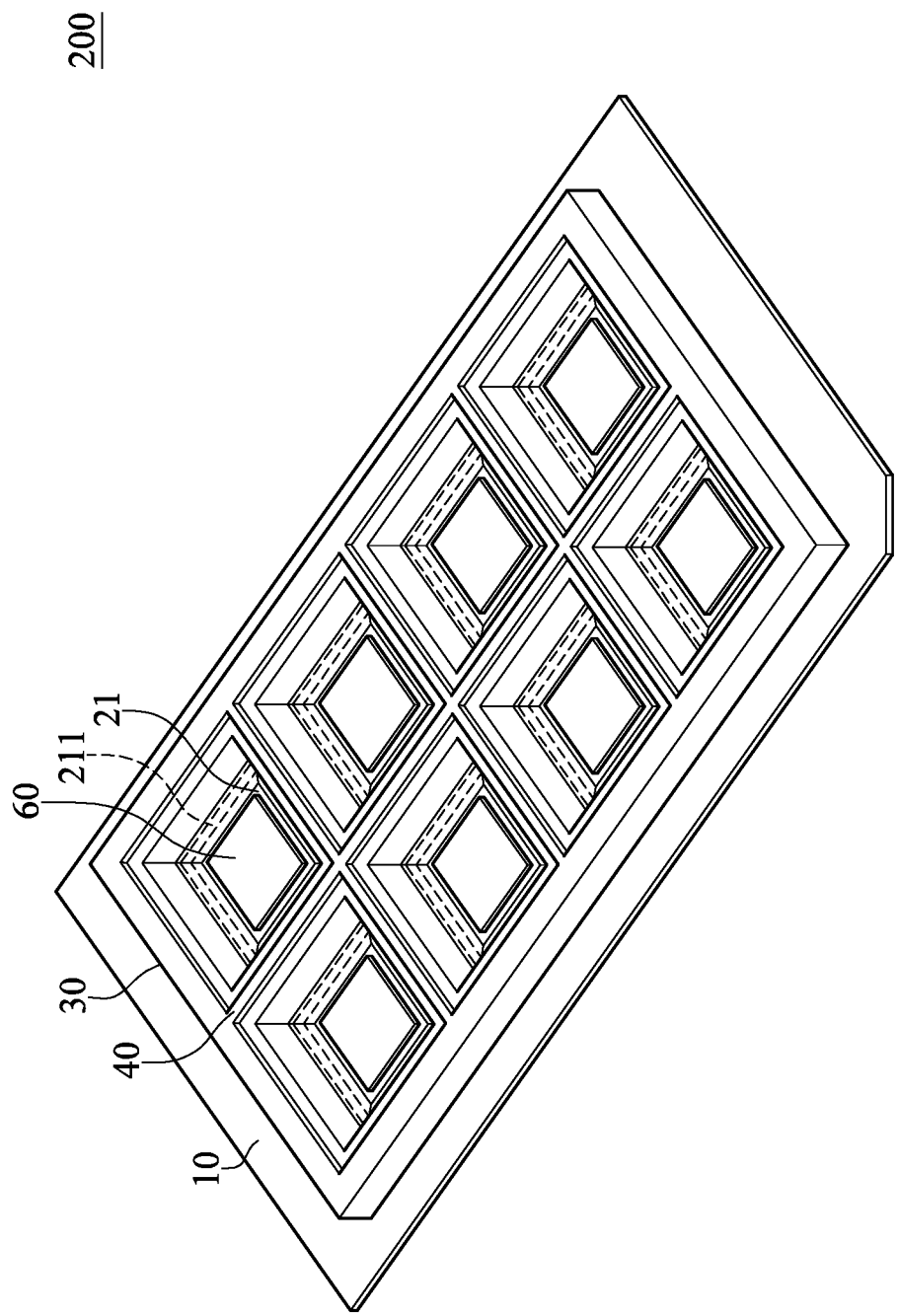
FIG. 5 is a perspective view showing a sensor package structure provided with the package base core of FIG. 4 according to a fifth embodiment of the present disclosure.

Reference is made to FIG. 5, which illustrates a sensor package structure provided with the package base core of the fourth embodiment. FIG. 5 is a perspective view showing a package structure 200, which has a plurality of package units in a matrix arrangement. The package structure 200 includes a substrate 10, a plurality of stoppers, a compound 30 cooperated with the stoppers to form a plurality of receiving troughs, and a plurality of sensing members 60 respectively arranged in the receiving troughs.

[Sixth Embodiment]

Figure 6:
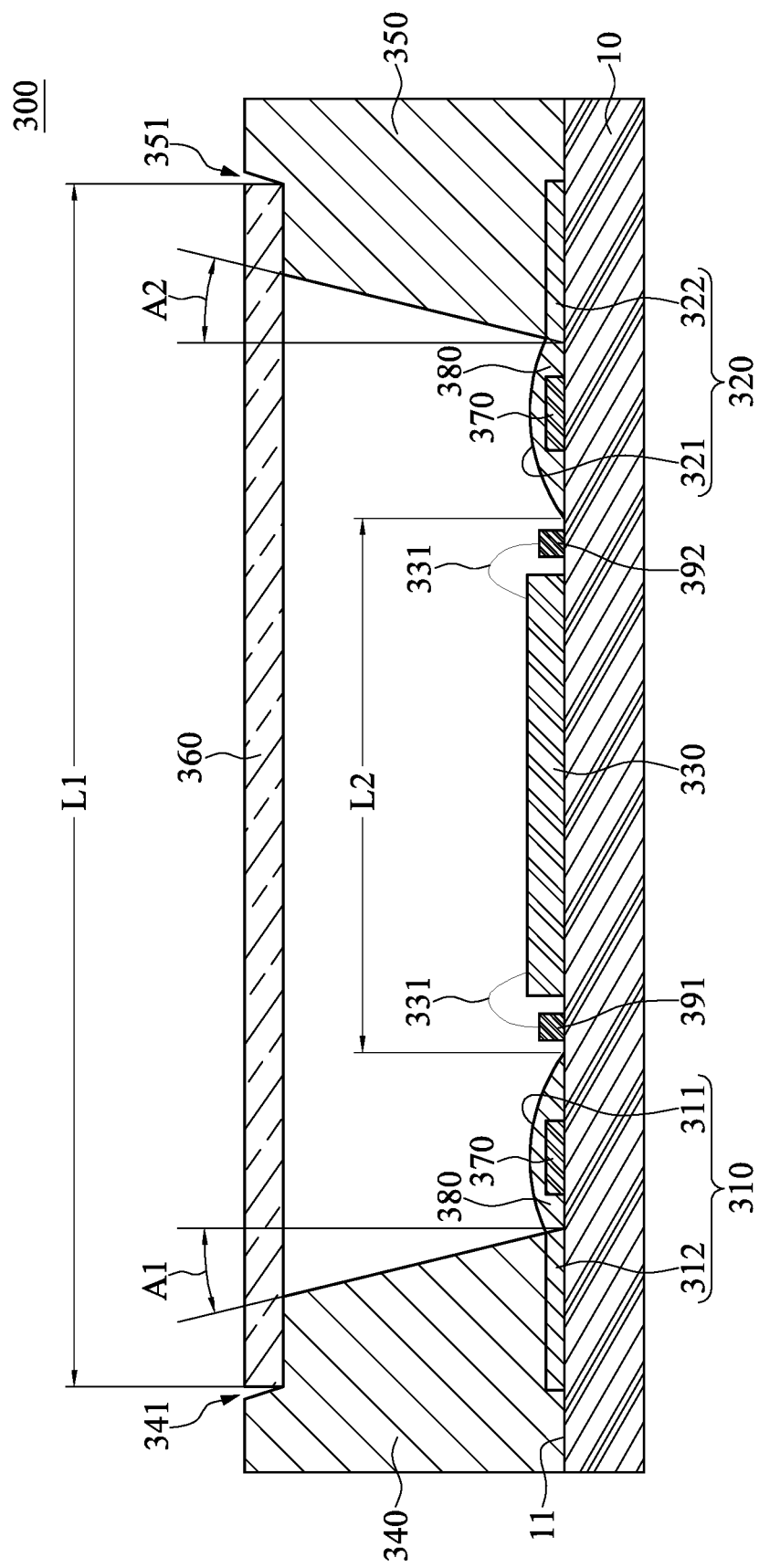
FIG. 6 is a cross-sectional view showing a sensor package structure according to a sixth embodiment of the present disclosure.

Reference is made to FIG. 6, which illustrates a sensor package structure 300 of a sixth embodiment. The sensor package structure 300 includes a substrate 10, a first stopper 310, a second stopper 320, a sensing member 330, a first compound 340, a second compound 350, and a translucent member 360.

As shown in FIG. 6, the substrate 10 of the sensor package structure 300 has an upper surface 11 and a lower surface 12 opposite to the upper surface 11. The substrate 10 can be a circuit substrate having at least one circuit cooperated with at least one via hole thereof. The upper surface 11 of the substrate 10 can be made of nonwovens.

As shown in FIG. 6, the first stopper 310 is disposed on the upper surface 11 of the substrate 10. The first stopper 310 has a first exposed portion 311 and a first shielding portion 312 arranged beside the first exposed portion 311.

The second stopper 320 is disposed on the upper surface 11 of the substrate 10. The second stopper 320 has a second exposed portion 321 and a second shielding portion 322 arranged beside the second exposed portion 321. It should be noted that the first stopper 310 and the second stopper 320 are in a mirror symmetrical arrangement.

As shown in FIG. 6, the sensing member 330 of the sensor package structure 300 is arranged between the first stopper 310 and the second stopper 320. The sensing member 330 can be at least one sensing chip or at least one sensing chip combined with other integral circuits. Specifically, the sensing member 330 is arranged between the first exposed portion 311 and the second exposed portion 321.

As shown in FIG. 6, a distance L2 between the first exposed portion 311 and the second exposed portion 321 is smaller than a distance L1 between the first shielding portion 312 and the second shielding portion 322. The sensing member 330 is disposed on the upper surface 11 of the substrate 10 and is arranged between the first exposed portion 311 and the second exposed portion 321.

As shown in FIG. 6, each of the first exposed portion 311 and the second exposed portion 321 includes a protrusion 370 and a covering layer 380 covering the protrusion 370, and the covering layers 380 are respectively connected to the first shielding portion 312 and the second shielding portion 322. Moreover, in other embodiments of the present disclosure, the substrate 10 can be formed as the structure shown in FIG. 1, which is provided without any protrusion.

As shown in FIG. 6, the first compound 340 of the sensor package structure 300 is disposed on the upper surface 11 and covers the first shielding portion 312. The second compound 350 is disposed on the upper surface 11 and covers the second shielding portion 322. A portion of the first compound 340 covers the first shielding portion 312, and the other portion of the first compound 340 is disposed on the upper surface 11 of the substrate 10. A portion of the second compound 350 covers the second shielding portion 322, and the other portion of the second compound 350 is disposed on the upper surface 11 of the substrate 10.

As shown in FIG. 6, a side of the first compound 340 arranged adjacent to the first exposed portion 311 has a first slanting angle A1 with respect to a fictitious plane perpendicular to the upper surface 11 of the substrate 10. A side of the second compound 350 arranged adjacent to the second exposed portion 321 has a second slanting angle A2 with respect to the fictitious plane. Each of the first slanting angle A1 and the second slanting angle A2 is within a range of 1~20 degrees. The first slanting angle A1 and the second slanting angle A2 preferably have the same degree.

As shown in FIG. 6, the first compound 340 has a first step portion 341, the second compound 350 has a second step portion 351, and two opposite ends of the translucent member 360 are respectively disposed on the first step portion 341 and the second step portion 351.

Accordingly, the first stopper 310 and the second stopper 320 of the sensor package structure 300 are provided to avoid an overflowing of the first compound 340 or the second compound 350, so that the translucent member 360 is not polluted and prevented from functioning normally.

In addition, the sensor package structure 300 further includes at least one first connecting pad 391 and at least one second connecting pad 392. The at least one first connecting pad 391 is arranged between the first exposed portion 311 and the sensing member 330, and at least one second connecting pad 392 is arranged between the second exposed portion 321 and the sensing member 330.

The first connecting pad 391 and the second connecting pad 392 can be electrically connected to the circuit or the via hole of the substrate 10. The sensing member 330 is electrically connected to the first connecting pad 391 and the second connecting pad 392 by using conductive wires 331, thereby establishing an electrical connection between the sensing member 330 and the circuit of the substrate 10. It should be noted that the first connecting pad 391 and the second connecting pad 392 can be disposed on or not disposed on the substrate 10.

In summary, the first stopper 310 and the second stopper 320 are provided to avoid an overflowing of the compound 30 (or the first compound 340 and the second compound 350), so that the package base core 100 or the sensor package structure 300 can maintain the normal function thereof and can increase the reliability thereof.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A sensor package structure, comprising:
    a substrate having an upper surface and a lower surface opposite to the upper surface;
    a first stopper disposed on the upper surface, the first stopper including a first exposed portion disposed on the upper surface and a first shielding portion arranged beside the first exposed portion, wherein an outer surface of the first exposed portion has a curved shape, and wherein a maximum height of the first exposed portion with respect to the upper surface is greater than that of the first shielding portion with respect to the upper surface;
    a second stopper disposed on the upper surface, and the second stopper including a second exposed portion disposed on the upper surface and a second shielding portion arranged beside the second exposed portion, wherein an outer surface of the second exposed portion has a curved shape, and wherein a maximum height of the second exposed portion with respect to the upper surface is greater than that of the second shielding portion with respect to the upper surface;

a sensing member disposed on the upper surface of the substrate and arranged between the first stopper and the second stopper;

a first compound disposed on the upper surface and covering the first shielding portion;

a second compound disposed on the upper surface and covering the second shielding portion; and a translucent member arranged above the sensing member, wherein two opposite ends of the translucent member are respectively connected to the first compound and the second compound.

2. The sensor package structure as claimed in claim 1, wherein a distance between the first exposed portion and the second exposed portion is smaller than that between the first shielding portion and the second shielding portion, and the sensing member is arranged between the first exposed portion and the second exposed portion.

3. The sensor package structure as claimed in claim 2, wherein each of the first exposed portion and the second exposed portion includes a protrusion and a covering layer covering the protrusion, and the maximum height of each of the first exposed portion and the second exposed portion is a maximum height of the covering layer of each of the first exposed portion and the second exposed portion.

4. The sensor package structure as claimed in claim 1, wherein a portion of the first compound covers the first shielding portion, the other portion of the first compound is disposed on the substrate, a portion of the second compound covers the second shielding portion, and the other portion of the second compound is disposed on the substrate.

5. The sensor package structure as claimed in claim 4, wherein a side of the first compound arranged adjacent to the first exposed portion has a first slanting angle with respect to a fictitious plane perpendicular to the substrate, and a side of the second compound arranged adjacent to the second exposed portion has a second slanting angle with respect to the fictitious plane.

6. The sensor package structure as claimed in claim 1, wherein the first compound has a first step portion, the second compound has a second step portion, and two opposite ends of the translucent member are respectively disposed on the first step portion and the second step portion.

7. The sensor package structure as claimed in claim 1, further comprising at least one first connecting pad and at least one second connecting pad, wherein the at least one first connecting pad is arranged between the first exposed portion and the sensing member, and the at least one second connecting pad is arranged between the second exposed portion and the sensing member.

8. The sensor package structure as claimed in claim 7, wherein the sensing member is electrically connected to the at least one first connecting pad and the at least one second connecting pad by use of conductive wires.

* * * * *